US010990119B2

(12) United States Patent
Murakami

(10) Patent No.: US 10,990,119 B2
(45) Date of Patent: Apr. 27, 2021

(54) REFERENCE VOLTAGE GENERATION CIRCUIT, POWER-ON DETECTION CIRCUIT, AND SEMICONDUCTOR DEVICE FOR PREVENTING INTERNAL CIRCUIT FROM OPERATING INCORRECTLY AT LOW VOLTAGE

(71) Applicant: Winbond Electronics Corp., Taichung (TW)

(72) Inventor: Hiroki Murakami, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/784,663

(22) Filed: Feb. 7, 2020

(65) Prior Publication Data
US 2020/0257324 A1 Aug. 13, 2020

(30) Foreign Application Priority Data

Feb. 7, 2019 (JP) .............................. JP2019-020246

(51) Int. Cl.
*G05F 3/20* (2006.01)
*G11C 16/04* (2006.01)
(Continued)

(52) U.S. Cl.
CPC ............ *G05F 3/20* (2013.01); *G11C 16/0483* (2013.01); *G11C 16/26* (2013.01); *G11C 16/30* (2013.01)

(58) Field of Classification Search
CPC .. G05F 3/20; G05F 3/30; G11C 16/26; G11C 16/30; G11C 16/0483; G11C 5/147; G11C 17/16
See application file for complete search history.

(56) References Cited

U.S. PATENT DOCUMENTS 4,961,007 A * 10/1990 Kumanoya ............. G05F 3/205
323/313
5,659,517 A * 8/1997 Arimoto ................... G11C 5/14
365/226
(Continued)

FOREIGN PATENT DOCUMENTS

CN 103308830 A 9/2013
JP H09-260597 A 10/1997
(Continued)

OTHER PUBLICATIONS

Office Action issued in corresponding JP patent application 2019-020246 dated Aug. 5, 2020 (with English translation attached thereto).

*Primary Examiner* — Gene N Auduong
(74) *Attorney, Agent, or Firm* — Muncy, Geissler, Olds & Lowe, P.C.

(57) ABSTRACT

A reference voltage generation circuit of the invention includes: PMOS transistors P1 and P2 configured to provide current sources with same current to a first current path and a second current path; a bipolar transistor Q1 connected to the PMOS transistors P1 on the first current path; a bipolar transistor Q2 connected to the PMOS transistors P2 on the second current path; a differential amplifier AMP controlling the gates of the PMOS transistors P1 and P2, such that a voltage of a node VN and a voltage of a node VP are equal; an output node BGR outputting a reference voltage Vref; and a reference voltage guarantee portion 130 outputting a detecting signal BGRDET when a differences between the voltage of the node VN and the voltage of the node VP is maintained below a determined value.

20 Claims, 6 Drawing Sheets

(51) Int. Cl.
*G11C 16/26* (2006.01)
*G11C 16/30* (2006.01)

(56) References Cited

U.S. PATENT DOCUMENTS

| | | | |
|---|---|---|---|
| 5,721,704 A * | 2/1998 | Morton | G11C 16/08 |
| | | | 365/185.23 |
| 6,507,179 B1 * | 1/2003 | Jun | G05F 3/30 |
| | | | 323/313 |
| 7,944,769 B1 | 5/2011 | Lesea | |
| 8,536,874 B1 * | 9/2013 | Cho | G01R 19/16552 |
| | | | 324/522 |
| 2005/0117406 A1 | 6/2005 | Atsumi et al. | |
| 2005/0237105 A1 | 10/2005 | Park | |
| 2018/0054258 A1 * | 2/2018 | Mori | H04B 10/588 |
| 2020/0212850 A1 * | 7/2020 | Yamashiro | G05F 1/468 |

FOREIGN PATENT DOCUMENTS

| | | | |
|---|---|---|---|
| JP | 2008077834 A | 4/2008 | |
| JP | 2008160399 A | 7/2008 | |
| JP | 2016-086253 A | 5/2016 | |
| TW | I559115 B | 11/2016 | |
| TW | I602045 B | 10/2017 | |

* cited by examiner

REFERENCE VOLTAGE GENERATION CIRCUIT, POWER-ON DETECTION CIRCUIT, AND SEMICONDUCTOR DEVICE FOR PREVENTING INTERNAL CIRCUIT FROM OPERATING INCORRECTLY AT LOW VOLTAGE

CROSS REFERENCE TO RELATED APPLICATIONS

This Application claims priority of Japanese Patent Application No. 2019-020246, filed on Feb. 7, 2019, the entirety of which is incorporated by reference herein.

BACKGROUND OF THE INVENTION

Field of the Invention

The present invention relates to a reference voltage generation circuit, and more particularly, to a circuit that generates a reference voltage by using a bandgap reference circuit.

Description of the Related Art

In semiconductor devices, such as flash memories, a power-on detection circuit is usually provided to detect whether the power supply voltage has reached a certain voltage after the semiconductor device is powered on. If the power-on detection circuit detects that the power supply voltage is above the certain voltage, a power-on procedure is then executed, and resetting of the internal circuit is performed. For example, considering that the operating voltage at the time of power-on is unstable, Japanese Patent Publication No. 2008-160399 discloses a power-on system reset circuit for starting the system after stabilization of power supply by stopping the procedure for starting the operation when the system is powered on, then resetting the system until the power supply is stable, and starting the system after the power supply has stabilized.

FIG. 1 shows a configuration of a conventional power-on detection circuit. The power-on detection circuit 10 comprises a reference voltage generation circuit 20 that generates a reference voltage Vref, an internal voltage generation circuit 30 that generates an internal voltage VI based on a supply voltage Vcc, and a comparison circuit 40 that is configured to generate a power-on detection signal PWR-DET based on the comparison result between the reference voltage Vref and the internal voltage VI. For example, when the internal voltage VI has reached the reference voltage Vref, the comparison circuit 40 outputs the power-on detection signal PWRDET to the internal circuit. The internal voltage generation circuit 30 divides, for example, the power supply voltage Vcc to generate an internal voltage VI.

The reference voltage Vref is used to determine whether the power supply voltage Vcc has reached a target voltage. Based on the target voltage, the internal voltage generation circuit 30 may generate the internal voltage VI which is a desired voltage which is higher than a voltage (hereinafter referred to as a guaranteed voltage) that guarantees the normal operation of the internal circuit. In order to prevent the internal circuit from malfunctioning at a low voltage, a high accuracy is required for setting the reference voltage Vref. For example, if the reference voltage Vref is set lower than the desired voltage, the power-on detection signal PWRDET will still be output when the power supply voltage Vcc does not reach the target voltage, so that the internal voltage VI provided to the internal circuit cannot guarantee the internal circuit to operate normally, which results in incorrect operation.

Therefore, a bandgap reference circuit (hereinafter referred to as a BGR circuit) that is almost independent of the variation in the power supply voltage Vcc or the operation temperature is used in the reference voltage generation circuit 20. FIG. 2 shows a structure of a conventional BGR circuit. As shown in FIG. 2, the BGR circuit comprises a first current path and a second current path which are formed between the power supply voltage Vcc and the ground potential GND and further comprises a differential amplifier circuit AMP. The first current path comprises a PMOS transistor P1, a resistor R1, and a bipolar transistor Q1 which are connected in series. The second current path comprises a PMOS transistor P2, a resistor R2, a resistor R, and a bipolar transistor Q2 which are connected in series. The inverting input terminal (−) of the differential amplifier circuit AMP is connected to the node VN between the resistor R1 and the bipolar transistor Q1, the non-inverting input terminal (+) of the differential amplifier circuit AMP is connected to the node VP between the resistor R2 and the resistor R, and the output terminal of the differential amplifier circuit AMP is connected to the gates of the transistors P1 and P2.

The PMOS transistors P1 and P2 operate as a current source that provides the currents with same current value to the first and second current paths respectively. The bipolar transistor Q1 operates to cause a first current to flow through the first current path, and the bipolar transistor Q2 operates to cause a second current to flow through the second current path. In addition, the differential amplifier circuit AMP controls the gate voltages of the transistors P1 and P2, so that the voltage of the node VN is equal to the voltage of the node VP (VN=VP). In other words, the differential amplifier circuit AMP adjusts the output voltage, so that the forward voltage of the bipolar transistor Q1 is equal to the voltage obtained by adding the forward voltage of the bipolar transistor Q2 and the voltage generated by the resistor R.

In the BGR circuit, the forward voltages of the bipolar transistors Q1 and Q2 have a negative temperature coefficient, and the voltage difference between the nodes VN and VP has a positive temperature coefficient. Thus, a temperature-independent circuit can be achieved by appropriately selecting the resistance values of the resistors R1, R2, and R.

When the voltages of the node VN and the node VP are equal, hereinafter referred to as VN=VP, wherein VP=VBE+(R×iBGR), and (R×iBGR)=VP−VBE. iBGR represents the current flowing through the resistor R. VP−VBE is calculated using the following equation, wherein R is the resistance of the resistor R, VBE is the base-emitter voltage, $K_B$ is the Boltzmann constant, e is the quantity of charge, n is the ratio of the area of the emitter of the bipolar transistor Q2 to the area of the emitter of the bipolar transistor Q1, and T is the absolute temperature.

$$VN = VP$$

$$VP - VBE = \text{delta } VBE = \frac{K_B T}{e} \ln(n)$$

-continued $$iBGR = \frac{\text{delta } VBE}{R}$$

$$e = 1.602 \times 10^{-19}$$

$$K_B = 1.381 \times 10^{-23}$$

FIG. 3 shows operation waveforms of the BGR circuit of FIG. 2. The power supply voltage Vcc is supplied at the time point t1, and the power supply voltage Vcc rises. The voltage of the output node BGR, the voltage of the node VN, the voltage of the node VP, and the base-emitter voltage VBE start to rise with the rising of the power supply voltage Vcc. The BGR circuit operates at a low voltage from the time point t1 to the time point t3 (meaning, it operates at a voltage lower than the guaranteed voltage). Therefore, the voltage of the node VN becomes constant at the time point t2, but the voltage of the node VP and the base-emitter voltage VBE are still unstable. After the time point t3, the BGR circuit operates at the desired voltage, and the differential amplifier circuit AMP adjusts the output voltage, so that the voltage of the node VN is equal to the voltage of the node VP and the output node BGR outputs a constant reference voltage Vref of about 1.25V.

In recent years, due to lowering of the power supply voltage Vcc (for example, Vcc=1.8V), the BGR circuit needs to operate at a low voltage. As shown in the time points t1~t3 in FIG. 3, the output node BGR outputs a reference voltage (hereinafter referred to as a low reference voltage Vref_L) which is lower than a desired voltage (1.25V). For example, when the power supply voltage Vcc becomes larger than the threshold value of the CMOS transistor constituting the differential amplifier circuit AMP, the output node BGR outputs the low reference voltage Vref_L. In this way, when the comparison circuit 40 compares the low reference voltage Vref_L with the internal voltage VI generated by the internal voltage generation circuit 30, even though the power supply voltage Vcc has not reached the target voltage, it outputs the power-on detection signal PWRDET with an H level. As a result, the internal circuit operates in an environment with a voltage lower than the guaranteed voltage, which may easily cause erroneous operation.

The above situation is shown in FIG. 4. The power supply voltage Vcc is supplied at the time point t1, and the power supply voltage Vcc rises. During the same period, the internal voltage VI, which is generated by the internal voltage generation circuit 30 using the resistance voltage division based on the power supply voltage Vcc, also rises. The ratio of the resistance voltage division is appropriately determined by the power supply voltage Vcc and the like.

At the time point t2, when the power supply voltage Vcc reaches the voltage Va, the BGR circuit starts operating. Because the internal voltage VI generated based on the power supply voltage Vcc at this time is lower than the guaranteed voltage of the BGR circuit, the output node BGR of the BGR circuit outputs a low reference voltage Vref_L. At this time, since the internal voltage VI is still lower than the low reference voltage Vref_L, the comparison circuit 40 does not output a power-on detection signal PWRDET with an H level.

At the time point t3, when the internal voltage VI becomes higher than or equal to the low reference voltage Vref_L, the comparison circuit 40 outputs the power-on detection signal PWRDET at the H level. It should be noted that even though the power supply voltage Vcc at this time rises to the voltage Vb, the voltage Vb is still lower than the voltage Vtg. Nevertheless, the internal circuit starts operating in response to the power-on detection signal PWRDET.

At the time point t4, the power supply voltage Vcc reaches the voltage Vtg, which causes the corresponding internal voltage VI to be equal to the guaranteed voltage, but, at this time, the reference voltage Vref output by the output node BGR has not reached a constant value. At the time point t5, the BGR circuit operates normally (that is, a constant reference voltage Vref is output) and output the reference voltage Vref which is equal to the desired voltage (for example, 1.25V). At this time, the power supply voltage Vcc is a target voltage Vc higher than the voltage Vtg. Ideally, the comparison circuit 40 should output the H-level power-on detection signal PWRDET at the time point t5, so that the internal circuit would start to operate when it reaches the desired voltage.

For example, in a NAND flash memory, fuses are used to store setting information, where the setting information includes, for example, voltages required for reading, programming, and erasing, or a user option. During the period when the flash memory is powered, when the H-level power-on detection signal PWRDET is detected, the setting information stored in the fuses is read to the register, and then the controller controls the operation based on the setting information held in the register.

FIG. 5 illustrates a read operation of fuses according to the example of FIG. 4. In FIG. 5, the vertical axis represents the power supply voltage Vcc. At the time point t1 at which the H-level power-on detection signal PWRDET is output, the power-on procedure starts, and the controller loads the setting information to the register from the fuses. Subsequently, the power supply voltage Vcc reaches the target voltage Vc at the time point t2.

When the power-on procedure is performed in a flash memory, a read operation of fuses is performed. The reading operation of the fuses is the same as a read operation in a general memory cell array: the codes, such as commands, stored in the ROM is read and executed by the CPU (central processing unit). That is, when the read operation of the fuses is performed, a clock signal is used to read the codes from the ROM, a charge pump is activated to generate the voltage used for the read operation, and bit lines are precharged during the read operation. Sometimes a peak current may be generated due to these operations, causing the power supply voltage Vcc to drop instantly.

If the power supply voltage Vcc is lower than the target voltage Vc or the power supply voltage Vcc drops in this situation, the operation margin of the sensing circuit will be insufficient, or the clock signal will be unstable, which results in that the codes cannot be read from the ROM correctly, and the read operation of the fuses becomes unstable. As a result, an unexpected operation occurs, or the reading from the ROM is interrupted. In particular, a memory which operates at a low voltage (for example, the power supply voltage Vcc is 1.8V) easily has the above problems due to its small operation margin. As described above, if the H-level power-on detection signal PWRDET is output when the power supply voltage is lower than the target voltage Vc or even than the voltage Vtg, it is difficult to ensure that the power-on procedure can operate normally, which may result in the failure or abnormality in the power-on procedure.

BRIEF SUMMARY OF THE INVENTION

The present invention is provided to solve an existing problem like above, and an object thereof is to provide a reference voltage generation circuit, a power-on detection circuit, and a semiconductor device, which can guarantee a normal operation of an internal circuit when the power is supplied.

An exemplary embodiment of the present invention provides a reference voltage generation circuit. The reference voltage generation circuit comprises a current source, a first PN junction element, a second PN junction element, an output node, a first differential amplifier circuit, and a reference voltage guarantee portion. The current source provides currents with the same current value to a first current path and a second current path respectively. The first PN junction element is coupled to the first current path and configured to cause a first current to flow though the first current path. The second PN junction element is coupled to the second current path and configured to cause a second current to flow through the second in the second current path, wherein the second current is larger than the first current. The output node is coupled to the second current path and configured to output a reference voltage The first differential amplifier circuit controls the current source to cause a voltage of a first node between the current source and the first PN junction element on the first current path to be equal to a voltage of a second node between the current source and the second PN junction element on the second current path. When a difference between the voltage of the first node and the voltage of the second node is maintained below than a determined value, the reference voltage guarantee portion outputs a detection signal indicating that the reference voltage has reached a desired voltage.

An exemplary embodiment of the present invention provides a power-on detection circuit. The power-on detection circuit comprises a reference voltage generation circuit as described above and a comparison circuit. The comparison circuit compares the reference voltage with an internal voltage which is generated based on a power supply voltage and outputs a power-on detection signal in response to a comparison result. The comparison circuit is enabled to compare the reference voltage with the internal voltage in response to the detection signal output by the reference voltage generation circuit.

An exemplary embodiment of the present invention provides a semiconductor device. The semiconductor device comprises a power-on detection circuit as described above. The semiconductor device performs a power-on procedure based on the power-on detection signal output by the power-on detection circuit in response to the detection signal output by the reference voltage generation circuit.

According to the embodiments of the present invention, the detection signal is output when the difference between the voltage of the first node and the voltage of the second node is maintained below than a determined value, which guarantees that the reference voltage has reached the desired voltage. As a result, the power-on detection circuit can prevent the internal circuit from operating incorrectly at a low voltage.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Next, an embodiment of the present invention will be described in detail with reference to the drawings. A power-on detection circuit of the present invention may be applied to a semiconductor device which is powered by a power supply voltage provided externally or internally, such as a flash memory, dynamic memory (DRAM), static memory (SRAM), variable resistive semiconductor memory (RRAM), magnetoresistive memory (MRAM), logics, or signal processing circuit.

Figure 1:
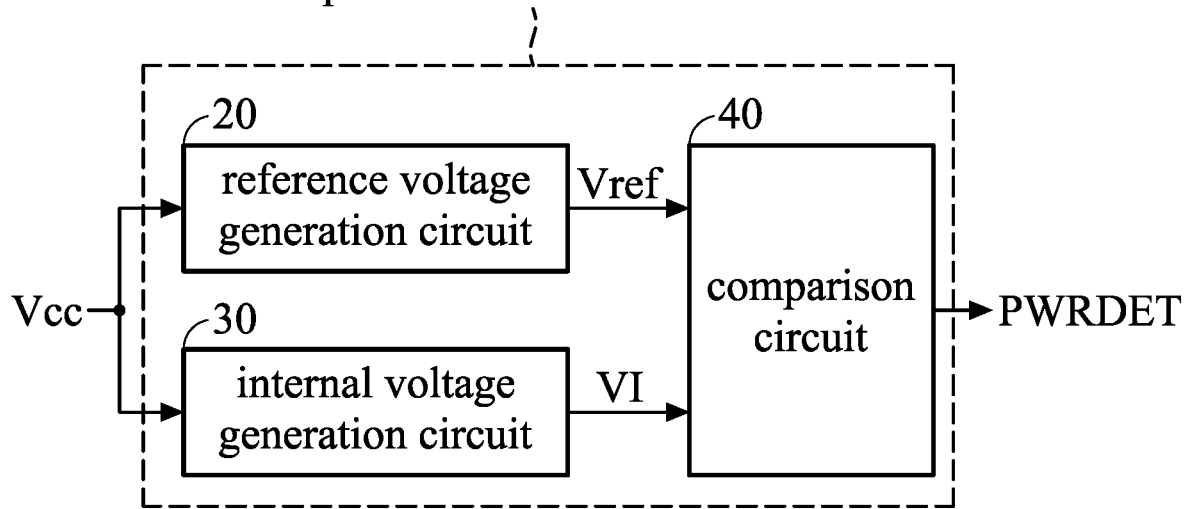
FIG. 1 shows a configuration of a conventional power-on detection circuit.
Figure 6:
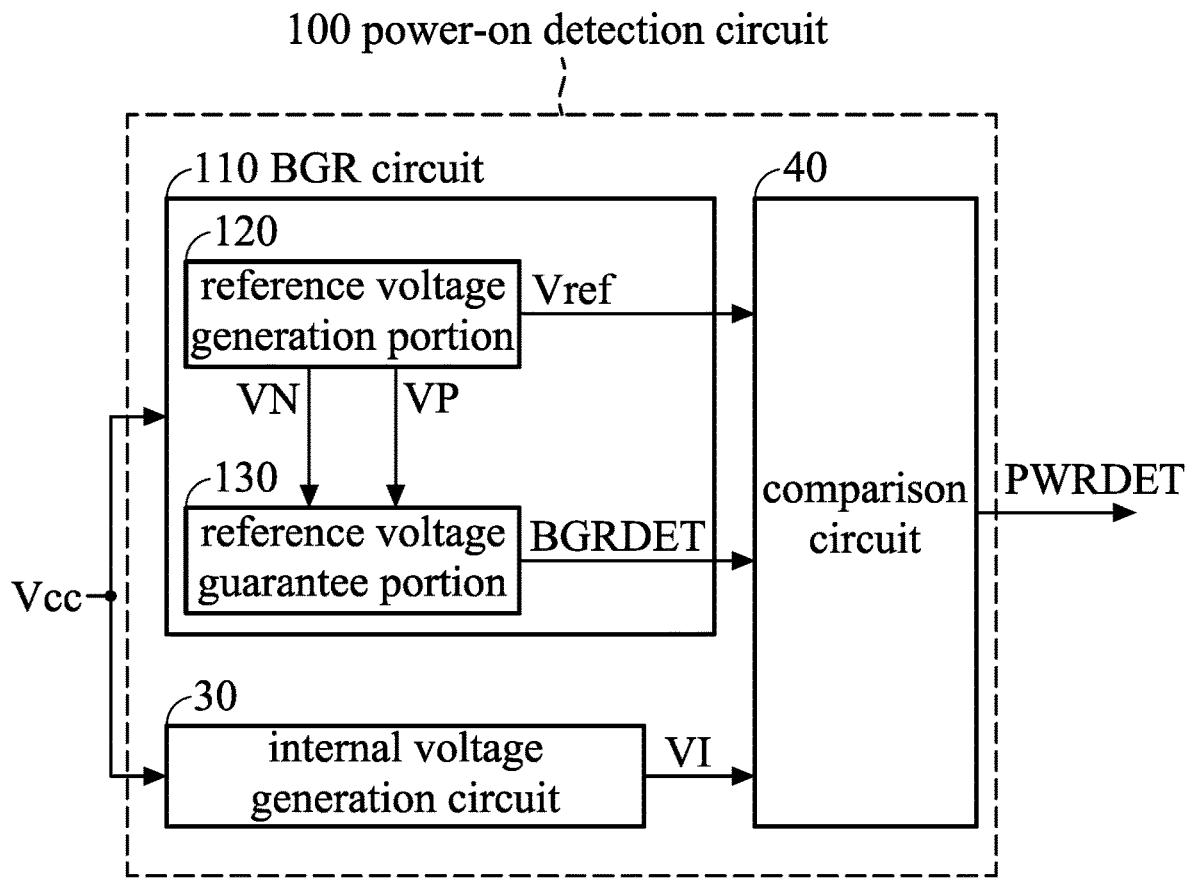
FIG. 6 shows a configuration of a power-on detection circuit according to an embodiment of the present invention.

FIG. 6 shows a configuration of a power-on detection circuit according to an embodiment of the present invention, and the same reference numeral is assigned to the element which is substantially the same as that shown in FIG. 1.

Figure 2:
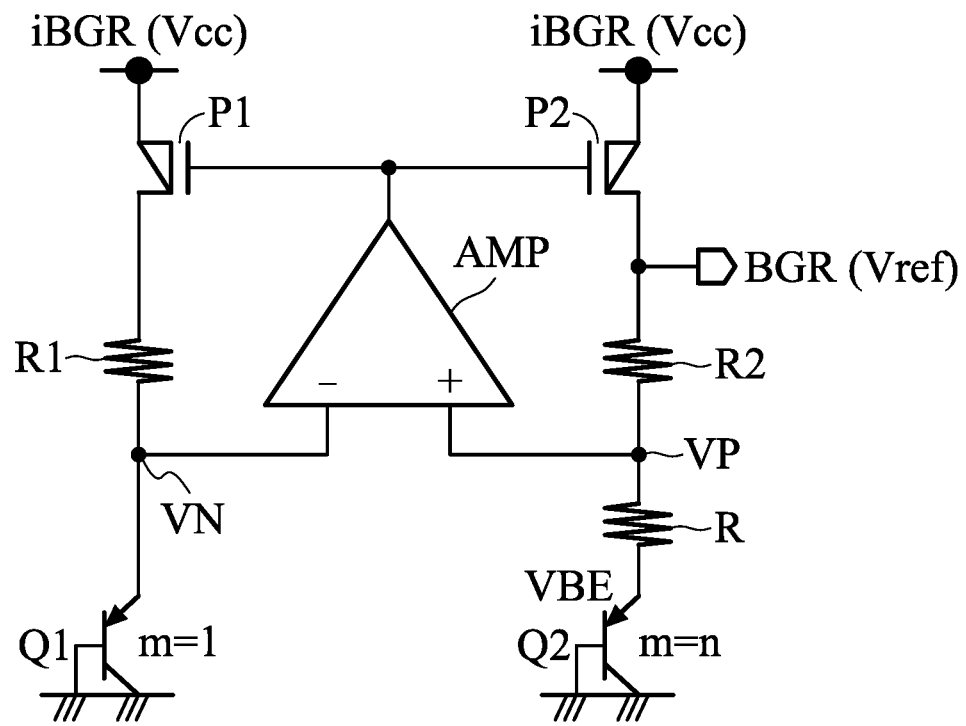
FIG. 2 shows a structure of a conventional bandgap reference (BGR) circuit.

The power-on detection circuit 100 of the embodiment comprises a BGR circuit 110, an internal voltage generation circuit 30, and a comparison circuit 40. The BGR circuit 110 comprises a reference voltage generation portion 120 and a reference voltage guarantee portion 130. The reference voltage generation portion 120 has the same configuration as the BGR circuit shown in FIG. 2, that is, it comprises a first current path and a second current path which are formed between a power supply voltage Vcc and a ground potential GND and further comprises a differential amplifier circuit AMP. The first current path comprises a PMOS transistor P1, a resistor R1, and a first PN junction element (such as a bipolar transistor Q1) which are connected in series; the second current path comprises a PMOS transistor P2, a resistor R2, a resistor R, and a second PN junction element (such as bipolar transistor Q2) which are connected in series. The inverting input terminal (−) of the differential amplifier circuit AMP is connected to a node VN between the resistor R1 and the bipolar transistor Q1, the non-inverting input terminal (+) of the differential amplifier circuit AMP is connected to a node VP between the resistor R2 and the resistor R, and the output terminal of the differential amplifier circuit AMP is connected to the gates of the transistors P1 and P2.

The first PN junction element and the second PN junction element may be diodes, PNP bipolar transistors, or NPN bipolar transistors. In this embodiment, the bipolar transistors Q1 and Q2 are diode-connected PNP bipolar transistors, and the base and collector of each of the bipolar transistors Q1 and Q2 are commonly connected to the ground GND. In addition, the ratio of the areas of the emitters of the bipolar transistors Q1 and Q2 is 1:n (n is a number greater than 1), that is, the area of the emitter of the bipolar transistor Q2 is n times the area of the emitter of the bipolar transistor Q1, and the current density of the transistor Q1 is n times the current density of the transistor Q2. In addition, although the bipolar transistors Q1 and Q2 are used here, diodes may replace the bipolar transistors Q1 and Q2. For example, the bipolar transistor Q1 may be replaced by one diode, and the bipolar transistor Q2 may be replaced by n diodes connected in parallel.

The PMOS transistors P1 and P2 operate as a current source that provides the currents with the same current value to the first and second current paths respectively. The first PN junction element operates to cause a first current to flow through the first current path, and the second PN junction element operates to cause a second current, which is larger than the first current, to flow through the second current path.

The reference voltage guarantee portion 130 monitors the voltages of the nodes VN and VP of the reference voltage generation portion 120. When the reference voltage guarantee portion 130 detects that the voltage of the node VP is equal to the voltage of the node VN or the voltage of the node VP is constant, it outputs a detection signal BGRDET to the comparison circuit 40. The detection signal BGRDET indicates that the reference voltage Vref is a desired voltage. In response to the detection signal BGRDET, the comparison circuit 40 compares the reference voltage Vref with the internal voltage VI, and outputs a power-on detection signal PWRDET to the internal circuit based on the comparison result.

Figure 3:
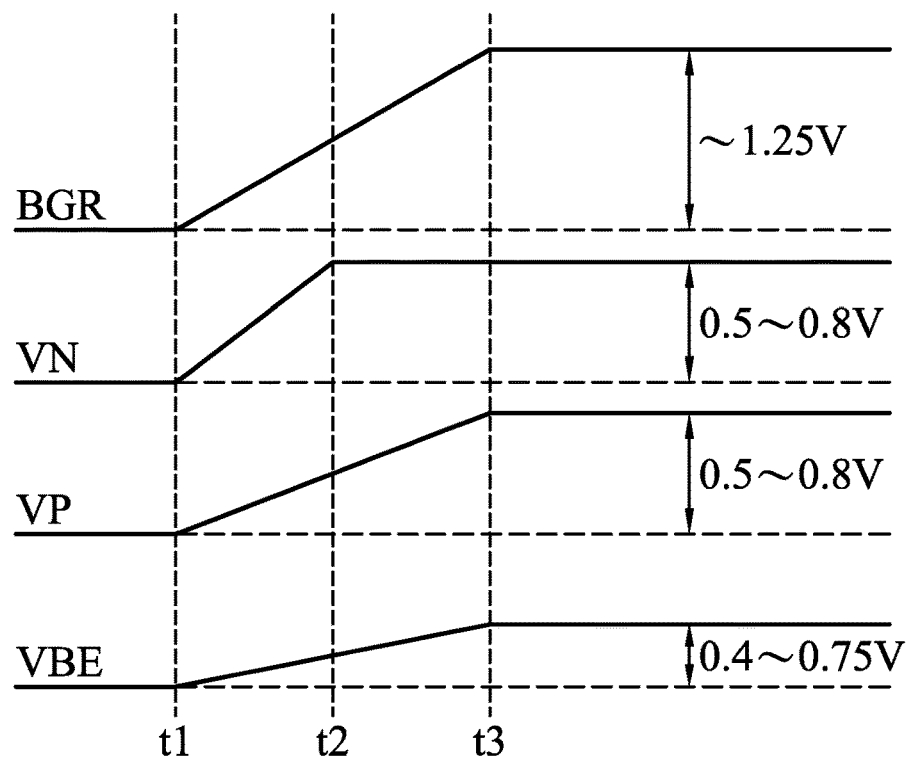
FIG. 3 shows voltage waveforms of nodes of the BGR circuit of FIG. 2 at different times.
Figure 4:
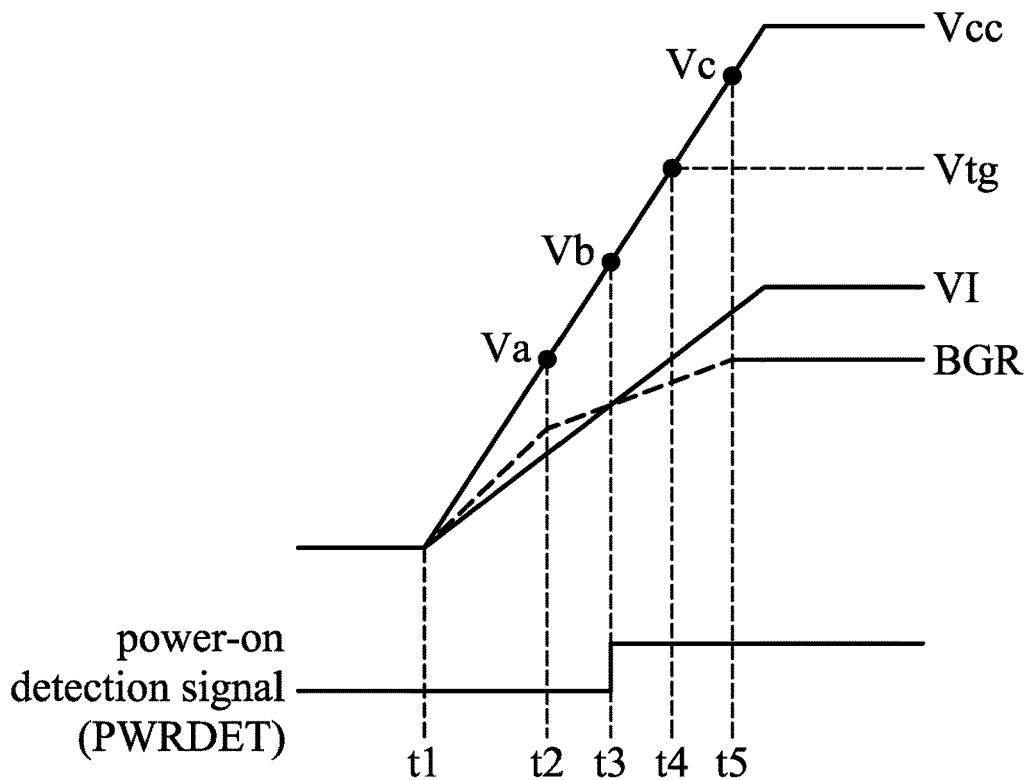
FIG. 4 is a waveform diagram illustrating an operation of each node of a conventional power-on detection circuit at different times.
Figure 5:
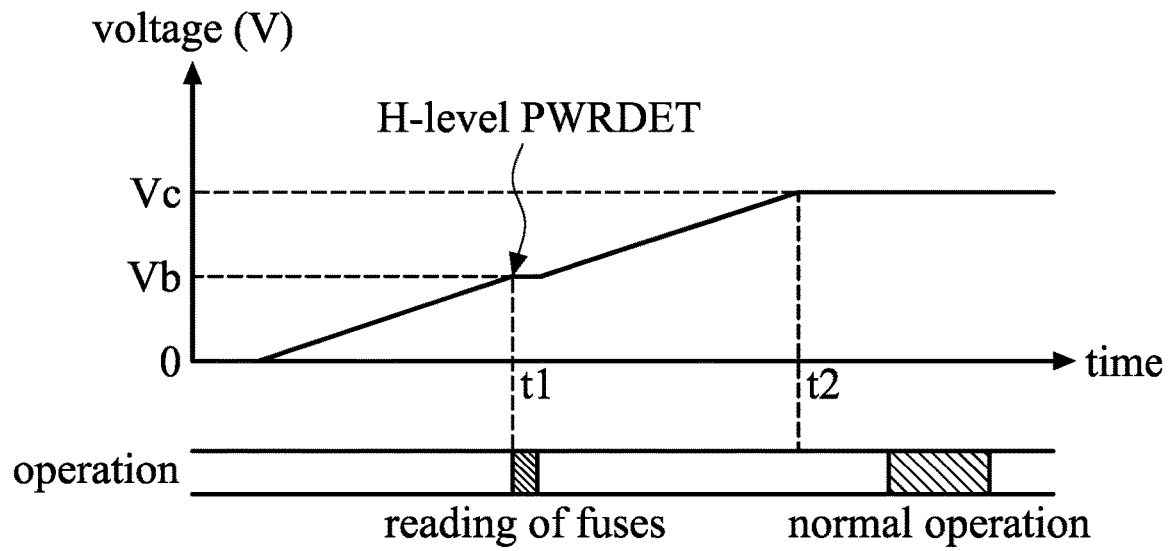
FIG. 5 illustrates problems of a read operation of fuses of a conventional flash memory.

As shown by FIG. 3 and FIG. 4, the reference voltage generation portion 120 operates in a low voltage state until the power supply voltage Vcc reaches to the target voltage Vc. However, before the time point t5, the power-on detection signal PWRDET at the H level may be output when the internal voltage VI becomes higher than or equal to the low reference voltage Vref_L output by the reference voltage generation portion 120 operating in the low voltage state at the time point t3 shown in FIG. 4. To overcome such problem, the present invention provides the reference voltage guarantee portion 130 for generating the detection signal BGRDET when the reference voltage guarantee portion 130 detects that the voltage of the node VP is equal to the voltage of the node VN or the voltage of the node VP is constant, therefore the detection signal BGRDET output to the comparison circuit 40 indicates that the reference voltage Vref output at the output node BGR has reached the desired voltage. In an example, the reference voltage guarantee portion 130 compares the voltage of the node VN with the voltage of the node VP of the reference voltage generation portion 120. When the difference between the two voltages is already 0 or a constant value which is less than a determined value, the detection signal BGRDET is output. When the BGR circuit operates at a guaranteed voltage, the differential amplifier circuit AMP adjusts the its output, so that the voltage of the node VN is equal to the voltage of the node VP. At this time, the reference voltage Vref is the desired voltage (1.25V). The comparison circuit 40 compares the reference voltage Vref with the internal voltage VI in response to the detection signal BGRDET and outputs the power-on detection signal PWRDET to the internal circuit, thereby preventing the internal circuit from operating incorrectly at a low voltage.

Figure 7:
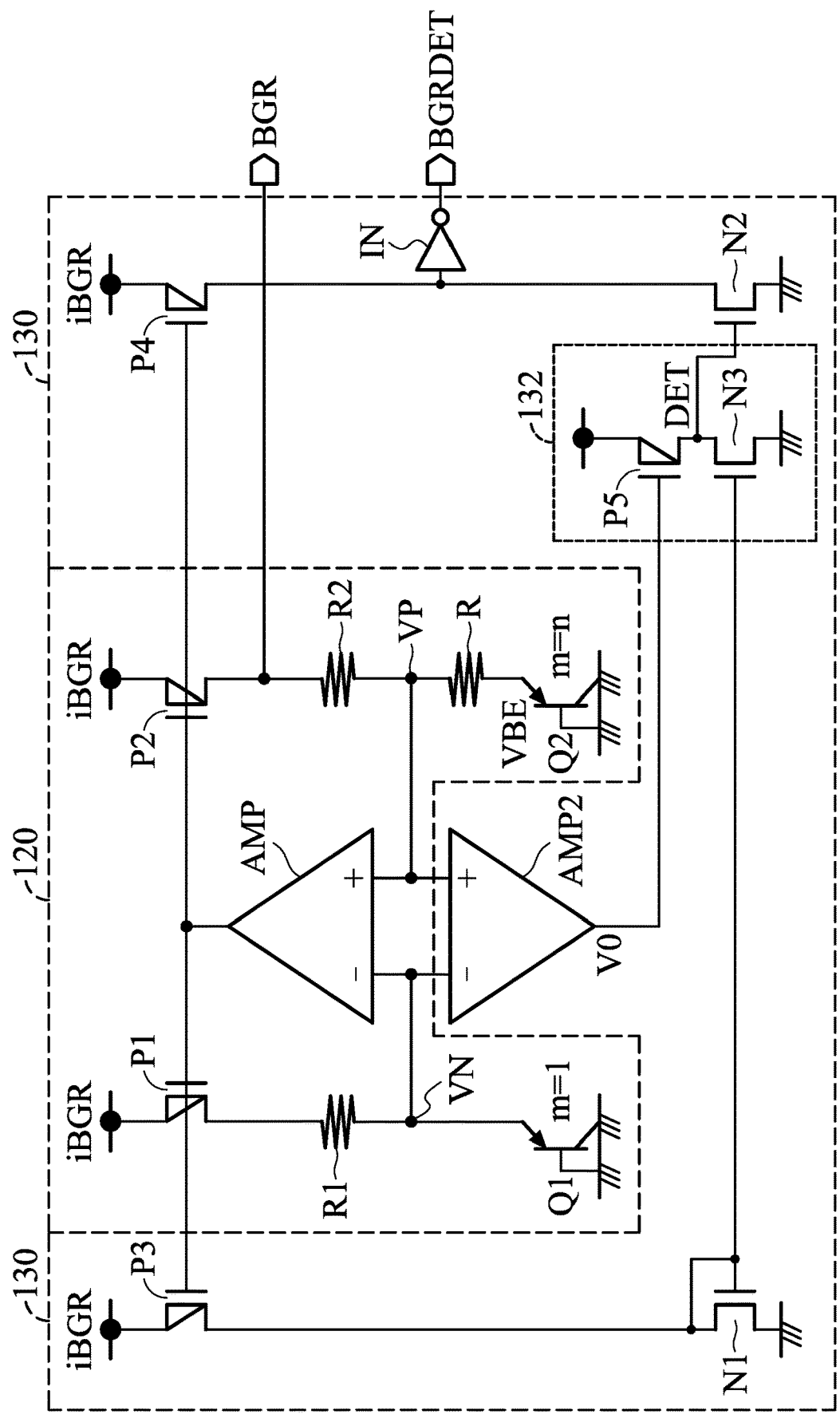
FIG. 7 shows a configuration of a BGR circuit according to an embodiment of the present invention.

Next, FIG. 7 shows a detailed circuit of the BGR circuit 110 of this embodiment. The reference voltage guarantee portion 130 coupled to the reference voltage generation portion 120 comprises PMOS transistors P3 and P4 which are commonly connected to the gates of the PMOS transistors P1 and P2 of the reference voltage generation portion 120, NMOS transistors N1 and N2 which are connected to the PMOS transistors P3 and P4 respectively, and a detection circuit 132 which comprises a PMOS transistor P5 and an NMOS transistor N3 connected in series between the power supply voltage and the ground potential GND. The reference voltage guarantee portion 130 further comprises a differential amplifier circuit AMP2 whose inverting input terminal (−) is connected to the node VN, non-inverting input terminal (+) is connected to the node VP between the resistor R2 and the resistor R, and output terminal V0 is output to the gate of the PMOS transistor P5 of the detection circuit 132. The reference voltage guarantee portion 130 also comprises an inverter IN which is connected between the PMOS transistor P4 and the NMOS transistor N2 and is configured to output the detection signal BGRDET.

The gates of the NMOS transistors N1 and N3 are commonly connected to the drain of the PMOS transistor P3, and the NMOS transistors N1 and N3 are in a turned-on state. The differential amplifier circuit AMP2 outputs a voltage in response to the difference between the voltage of the node VN and the voltage of the node VP to the detection circuit 132 via the output terminal V0. In other words, when the difference between the voltage of the node VN and the voltage of the node VP is large, a corresponding large output voltage is output to the gate of the PMOS transistor P5, such that the PMOS transistor P5 is in a turned-off state, and the node DET of the detection circuit 132 is at an L level. Accordingly, the transistor N2 is turned off, and the output of the inverter IN is at the L level. On the other hand, when the difference between VN and VP is very small, a corresponding small output voltage is output to the PMOS transistor P5, such that the PMOS transistor P5 is the turned-on state, the node DET of the detection circuit 132 is at an H level. Accordingly, the NMOS transistor N2 is turned on, and the inverter IN outputs the H-level detection signal BGRDET.

Figure 8:
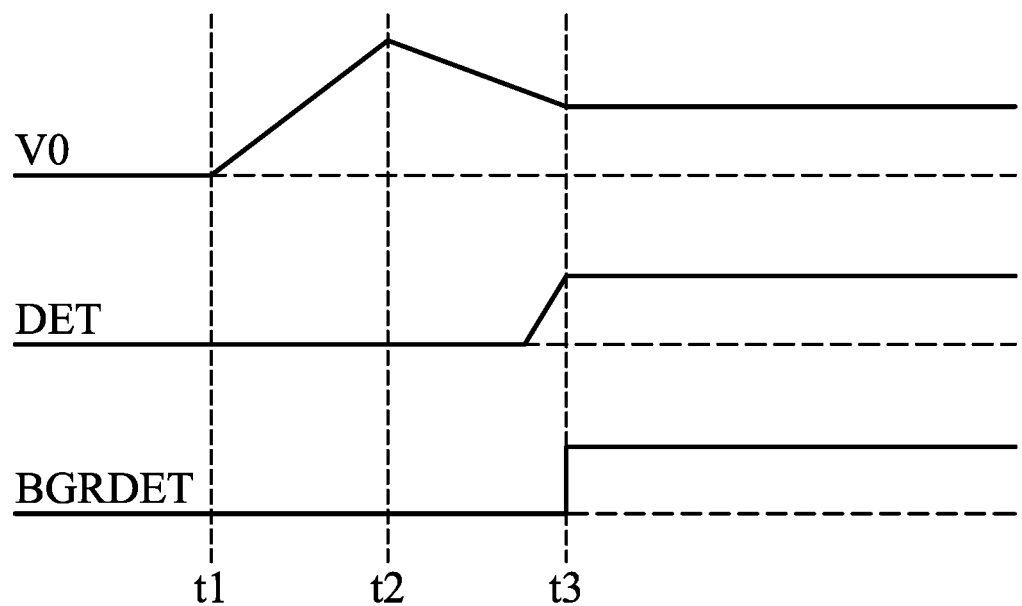
FIG. 8 shows voltage waveforms of different nodes of a BGR circuit at different times according to an embodiment of the present invention.

FIG. 8 shows voltage waveforms of the various nodes of the reference voltage guarantee portion 130 at different times. The time points t1 to t3 correspond to the time points t1~t3 shown in FIG. 3. The power supply voltage Vcc is supplied at the time point t1. During the period from the time point t1 to the time point t2, the voltage of the node VN rises faster than the voltage of the node VP, so the voltage difference between the voltage of the node VN and the voltage of the node VP gradually increases, and the voltage at the output terminal V0 of the differential amplifier circuit AMP2 gradually increases. At the time point t2, the voltage of the node VN becomes constant. During the period from the time point t2 to the time point t3, the voltage difference between the voltage of the node VN and the voltage of the node VP gradually decreases, and the voltage at the output terminal V0 of the differential amplifier circuit AMP2 gradually decreases. At the time point t3, the voltage of the node VP becomes constant, the voltage difference between the voltage of the node VN and the voltage of the node VP is maintained at a constant value lower than a determined value, and the voltage at the output terminal V0 of the differential amplifier circuit AMP2 also becomes a relatively small constant voltage. As the power supply voltage Vcc supplied to the detection circuit 132 rises, the detection circuit 132 starts operating normally at the time point t3. At this time, the output terminal V0 of the differential amplifier circuit AMP2 is at a small voltage, the PMOS transistor P5 is turned on, and the node DET is at the H level. Thereby, the inverter IN outputs the H-level detection signal BGR-DET.

As described above, when the voltage difference between the voltage of the node VN and the voltage of the node VP is maintained at the constant value (in other words, when the output node BGR outputs the stabilized reference voltage Vref), the reference voltage guarantee portion 130 outputs the H-level detection signal BGRDET, which guarantees that the reference voltage Vref used by the comparison circuit 40 is the desired voltage. The comparison circuit 40 is capable of comparing the reference voltage Vref generated by the reference voltage generation portion 120 with the internal voltage VI in response to the detection signal BGRDET that has been shifted to the H level, thereby outputting the H-level power-on detection signal PWRDET. Therefore, it is possible to prevent the internal circuit from operating incorrectly at a low voltage which is lower than the target voltage.

Figure 9:
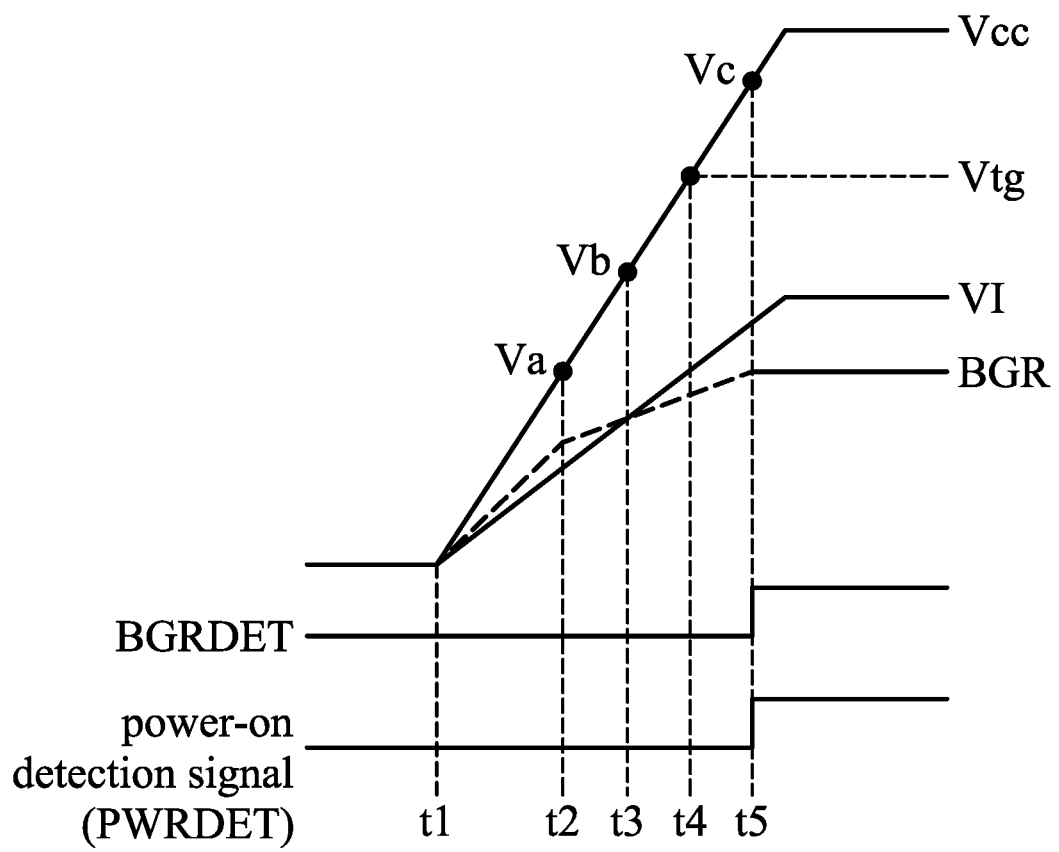
FIG. 9 is a waveform diagram illustrating an operation of a power-on detection circuit according to an embodiment of the present invention.

FIG. 9 illustrates the operation of the power-on detection circuit 100 according to the embodiment. The time points t1~t5 correspond to the time points t1~t5 in FIG. 4. The power supply voltage Vcc is supplied at the time point t1. The reference voltage generation portion 120 starts operating at a low voltage at the time point t2 to generate a low reference voltage Vref_L. At the time point t3, even though the internal voltage VI becomes higher than or equal to the low reference voltage Vref_L, since the detection signal BGRDET is still at the L level, the comparison circuit 40 is not enabled, and the power-on detection signal PWRDET is still at the L level.

At the time point t4, the power supply voltage Vcc reaches the voltage Vtg. At the time point t5, the reference voltage Vref generated by the reference voltage generation portion 120 becomes the desired voltage, and at the same time, the H-level detection signal BGRDET is output by the reference voltage guarantee portion 130. The comparison circuit 40 is enabled in response to the detection signal BGRDET to compare the reference voltage Vref with the internal voltage VI. When the internal voltage VI is higher than or equal to the reference voltage Vref, the H-level power-on detection signal PWRDET is output to the internal circuit.

As described above, according to the embodiment, when the reference voltage Vref has reached the desired voltage, the power-on detection circuit 100 outputs the power-on detection signal PWRDET to the internal circuit, so that the internal circuit operates after the power supply voltage Vcc reaches the target voltage or the guaranteed voltage, thereby preventing the power-on procedure from being performed incorrectly or being interrupted.

Figure 10:
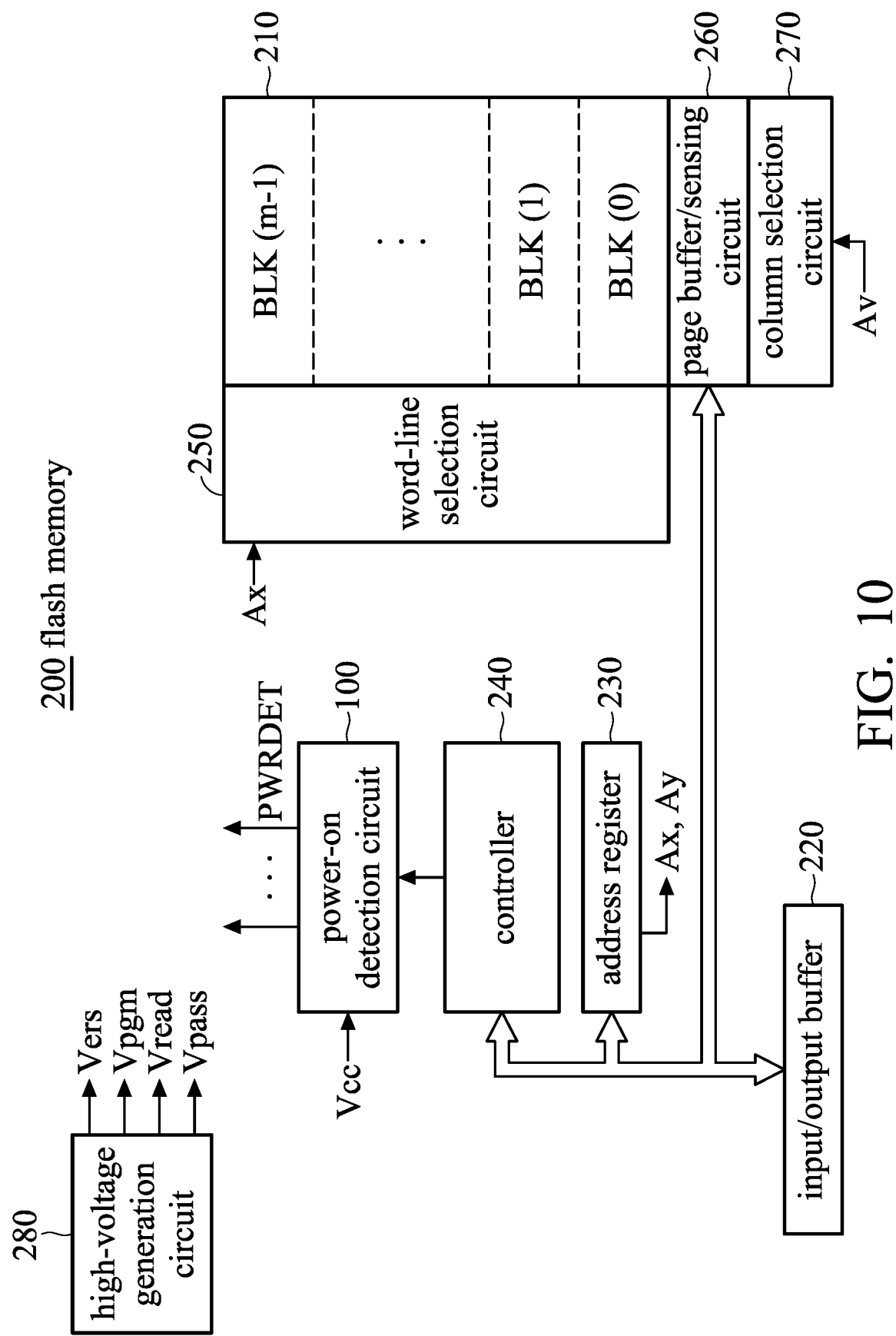
FIG. 10 is a block diagram showing a configuration of a NAND flash memory according to an embodiment of the present invention.

Next, a NAND flash memory to which the power-on detection circuit of the embodiment is applied will be described. FIG. 10 shows a configuration of a NAND-type flash memory according to an embodiment. The flash memory 200 comprises a memory cell array 210, an input/output buffer 220, an address register 230, a controller 240, a word-line selection circuit 250, a page buffer/sensing circuit 260, a column selection circuit 270, a high-voltage generation circuit 280, and the aforementioned power-on detection circuit 100. The memory cell array 210 comprises a plurality of blocks comprising a plurality of memory cells. The input/output buffer 220 is connected to an external input/output terminal I/O. The address register 230 receives address data from the input/output buffer 220. The controller 240 receives instruction data from input/output buffer 220 and controls respective portions of the NAND flash memory. The word-line selection circuit 250 receives row address information Ax from the address register 230, decodes the row address information Ax, and performs block selection and word line selection based on the decoded result. The page buffer/sensing circuit 260 holds the data read from the page selected by the word-line selection circuit 250 and holds the input data which should be programmed to the selected page. The column selection circuit 270 receives column address information Ay from the address register 230, decodes the column address information Ay, and selects the data at the column address in the page buffer/sensing circuit 260 based on the decoded result. The high-voltage generation circuit 280 generates various voltages necessary for reading, programming, and erasing data (the programming voltage Vpgm, the passing voltage Vpass, the read passing voltage Vread, the erasing voltage Vers and so on). When the power is supplied, i.e., the flash memory 200 is powered on, the power-on detection circuit 100 enables the comparison circuit 40 included in the power-on detection circuit 100 based on the detection signal BGRDET of the reference voltage guarantee portion 130 included in the power-on detection circuit 100 for indicating whether the power supply voltage Vcc has reached a power-on voltage level (for example, a target voltage).

When the power supply voltage Vcc has reached the target voltage, the internal voltage VI generated by the internal voltage generation circuit 30 of the power-on detection circuit 100 can be provided to any one or a combination of the input/output buffer 220, the address register 230, the controller 240, and the page buffer/sensing circuit 260, and the column selection circuit 270 for executing their operations. However, the present invention is not limited thereto. In addition, the various voltages generated by the high-voltage generation circuit 280 are higher than the internal voltage VI.

The memory cell array 210 comprises a plurality of fuses which are used to store voltage settings required for reading, programming, erasing, or user settings. When the controller 240 receives the power-on detection signal PWRDET from the power-on detection circuit 100, it performs the power-on procedure. The power-on procedure comprises the process of loading the setting information stored in these fuses into the register. In the embodiment, the power-on detection circuit 100 is configured to cause the H-level power-on detection signal PWRDET to be output in response to the detection signal BGRDET from the reference voltage guarantee portion 130, thereby causing the internal voltage VI, which is provided to each portion, to be high than the guaranteed voltage. Thus, the power-on procedure can be performed appropriately without interruption or incorrect operation.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A reference voltage generation circuit comprising:
   a current source providing currents with the same current value to a first current path and a second current path respectively;
   a first PN junction element, coupled to the first current path, causing a first current to flow though the first current path;
   a second PN junction element, coupled to the second current path, causing a second current to flow through the second current path, wherein the second current is larger than the first current;
   an output node, coupled to the second current path, outputting a reference voltage;
   a first differential amplifier circuit controlling the current source to cause a voltage of a first node between the current source and the first PN junction element on the first current path to be equal to a voltage of a second node between the current source and the second PN junction element on the second current path; and
   a reference voltage guarantee portion outputting a detection signal indicating that the reference voltage has reached a desired voltage when a difference between the voltage of the first node and the voltage of the second node is maintained below than a determined value.

2. The reference voltage generation circuit as claimed in claim 1,
   wherein the reference voltage guarantee portion comprises:
   a second differential amplifier circuit which compares the voltage of the first node with the voltage of the second node and;
   a detection circuit coupled between a power supply voltage and a ground potential, and including a transistor having a first gate terminal coupled to an output terminal of the second differential amplifier circuit, wherein a first terminal of the transistor is coupled to the power supply and a second terminal of the transistor is coupled to a third node for outputting a control signal for controlling the level of the detection signal,
   wherein the reference voltage guarantee portion outputs the detection signal based on a comparison result between the voltage of the first node and the voltage of the second node.

3. The reference voltage generation circuit as claimed in claim 2, wherein the reference voltage guarantee portion further comprises:
   a PMOS transistor having a gate terminal coupled to a gate terminal of the current source; and
   an NMOS transistor having a first terminal coupled to the PMOS transistor, having a gate terminal coupled to the third node for outputting the control signal, and having a second terminal coupled to the ground potential,
   wherein the detection signal is generated based on the level on a fourth node between the PMOS transistor and the NMOS transistor.

4. The reference voltage generation circuit as claimed in claim 1, wherein when the voltage of the second node has stabilized, the reference voltage guarantee portion outputs the detection signal.

5. The reference voltage generation circuit as claimed in claim 1, wherein the second current path comprises a resistor coupled between the second node and the second PN junction element, the first current path comprises a first resistor between the current source and the first node, and the second current path comprises a second resistor between the current source and the second node.

6. The reference voltage generation circuit as claimed in claim 1, wherein the first PN junction element and the second PN junction element are diodes, PNP bipolar transistors, or NPN bipolar transistors.

7. The reference voltage generation circuit as claimed in claim 1, wherein the reference voltage generation circuit includes a bandgap reference circuit comprising the current source, the first PN junction element, the second PN junction element, the output node, and the first differential amplifier circuit.

8. A power-on detection circuit comprises:
   a reference voltage generation circuit as claimed in claim 1; and
   a comparison circuit comparing the reference voltage with an internal voltage which is generated based on a power supply voltage and outputting a power-on detection signal in response to a comparison result,
   wherein the comparison circuit is enabled to compare the reference voltage with the internal voltage in response to the detection signal output by the reference voltage generation circuit.

9. The power-on detection circuit as claimed in claim 8, wherein the reference voltage guarantee portion comprises:
   a second differential amplifier circuit which compares the voltage of the first node with the voltage of the second node and;
   a detection circuit coupled between a power supply voltage and a ground potential, and including a transistor having a first gate terminal coupled to an output terminal of the second differential amplifier circuit, wherein a first terminal of the transistor is coupled to the power supply and a second terminal of the transistor is coupled to a third node for outputting a control signal for controlling the level of the detection signal,
   wherein the reference voltage guarantee portion outputs the detection signal based on a comparison result between the voltage of the first node and the voltage of the second node.

10. The power-on detection circuit as claimed in claim 9, wherein the reference voltage guarantee portion further comprises:
    a PMOS transistor having a gate terminal coupled to a gate terminal of the current source; and
    an NMOS transistor having a first terminal coupled to the PMOS transistor, having a gate terminal coupled to the third node for outputting the control signal, and having a second terminal coupled to the ground potential,
    wherein the detection signal is generated based on the level on a fourth node between the PMOS transistor and the NMOS transistor.

11. The power-on detection circuit as claimed in claim 8, wherein when the voltage of the second node has stabilized, the reference voltage guarantee portion outputs the detection signal.

12. The power-on detection circuit as claimed in claim 8, wherein the second current path comprises a resistor coupled between the second node and the second PN junction element, the first current path comprises a first resistor between the current source and the first node, and the second current path comprises a second resistor between the current source and the second node.

13. The power-on detection circuit as claimed in claim 8, wherein the first PN junction element and the second PN junction element are diodes, PNP bipolar transistors, or NPN bipolar transistors.

14. A semiconductor device comprises:
a power-on detection circuit as claimed in claim 8,
wherein the semiconductor device performs a power-on procedure based on the power-on detection signal output by the power-on detection circuit in response to the detection signal output by the reference voltage generation circuit.

15. The semiconductor device as claimed in claim 14,
wherein the reference voltage guarantee portion comprises:
a second differential amplifier circuit which compares the voltage of the first node with the voltage of the second node and;
a detection circuit coupled between a power supply voltage and a ground potential, and including a transistor having a first gate terminal coupled to an output terminal of the second differential amplifier circuit, wherein a first terminal of the transistor is coupled to the power supply and a second terminal of the transistor is coupled to a third node for outputting a control signal for controlling the level of the detection signal,
wherein the reference voltage guarantee portion outputs the detection signal based on a comparison result between the voltage of the first node and the voltage of the second node.

16. The semiconductor device as claimed in claim 15, wherein the reference voltage guarantee portion further comprises:

a PMOS transistor having a gate terminal coupled to a gate terminal of the current source; and
an NMOS transistor having a first terminal coupled to the PMOS transistor, having a gate terminal coupled to the third node for outputting the control signal, and having a second terminal coupled to the ground potential,
wherein the detection signal is generated based on the level on a fourth node between the PMOS transistor and the NMOS transistor.

17. The semiconductor device as claimed in claim 14, wherein when the voltage of the second node has stabilized, the reference voltage guarantee portion outputs the detection signal.

18. The semiconductor device as claimed in claim 14, wherein the second current path comprises a resistor coupled between the second node and the second PN junction element, the first current path comprises a first resistor between the current source and the first node, and wherein the second current path comprises a second resistor between the current source and the second node.

19. The semiconductor device as claimed in claim 14, wherein the first PN junction element and the second PN junction element are diodes, PNP bipolar transistors, or NPN bipolar transistors.

20. The semiconductor device as claimed in claim 14, wherein the semiconductor device is a NAND-type flash memory, and when the power-on procedure is performed, setting information related to an operation stored in the memory cells is read.

\* \* \* \* \*